United States Patent [19]

Hosokawa

[11] Patent Number: 5,106,200
[45] Date of Patent: Apr. 21, 1992

[54] APPARATUS FOR MEASURING TEMPERATURE OF WAFER

[75] Inventor: Akihiro Hosokawa, San Jose, Calif.

[73] Assignee: Applied Materials, Inc., Santa Clara, Calif.

[21] Appl. No.: 632,942

[22] Filed: Dec. 20, 1990

[51] Int. Cl.⁵ .............................. G01J 5/12; G01K 1/14
[52] U.S. Cl. ..................... 374/121; 374/208; 324/158 R
[58] Field of Search .......... 324/104, 158 F, 158 R X; 374/45, 120, 121, 179, 208; 250/338.3, 353

[56] References Cited

U.S. PATENT DOCUMENTS

| 933,543 | 9/1909 | Foster | 374/121 X |
|---|---|---|---|
| 3,745,460 | 7/1973 | Belzer et al. | 374/29 X |
| 3,979,671 | 9/1976 | Meeker et al. | 324/158 F |
| 4,607,960 | 8/1986 | Wulff | 374/7 |
| 4,851,764 | 7/1989 | Usui | 324/158 F |
| 4,864,227 | 9/1989 | Sato | 324/158 F |
| 4,890,245 | 12/1989 | Yomoto et al. | 374/121 X |
| 4,965,515 | 10/1990 | Karasawa | 324/158 F X |
| 4,989,991 | 2/1991 | Pecot et al. | 324/158 F X |

Primary Examiner—William A. Cuchlinski, Jr.
Assistant Examiner—G. Bradley Bennett
Attorney, Agent, or Firm—Keiichi Nishimura

[57] ABSTRACT

An apparatus for measuring the temperature of a wafer by a non-contact method includes a supporting device, at a specified position on which the wafer is placed horizontally. A thermocouple is provided with a heat collector at one end thereof. The heat collector is disposed near but in non-contacting relationship with the wafer at the specified position. A reflector capable of reflecting radiant heat is disposed near the heat collector and on the opposite side thereof from the wafer such that radiant heat from the wafer can be efficiently collected by the heat collector.

9 Claims, 3 Drawing Sheets

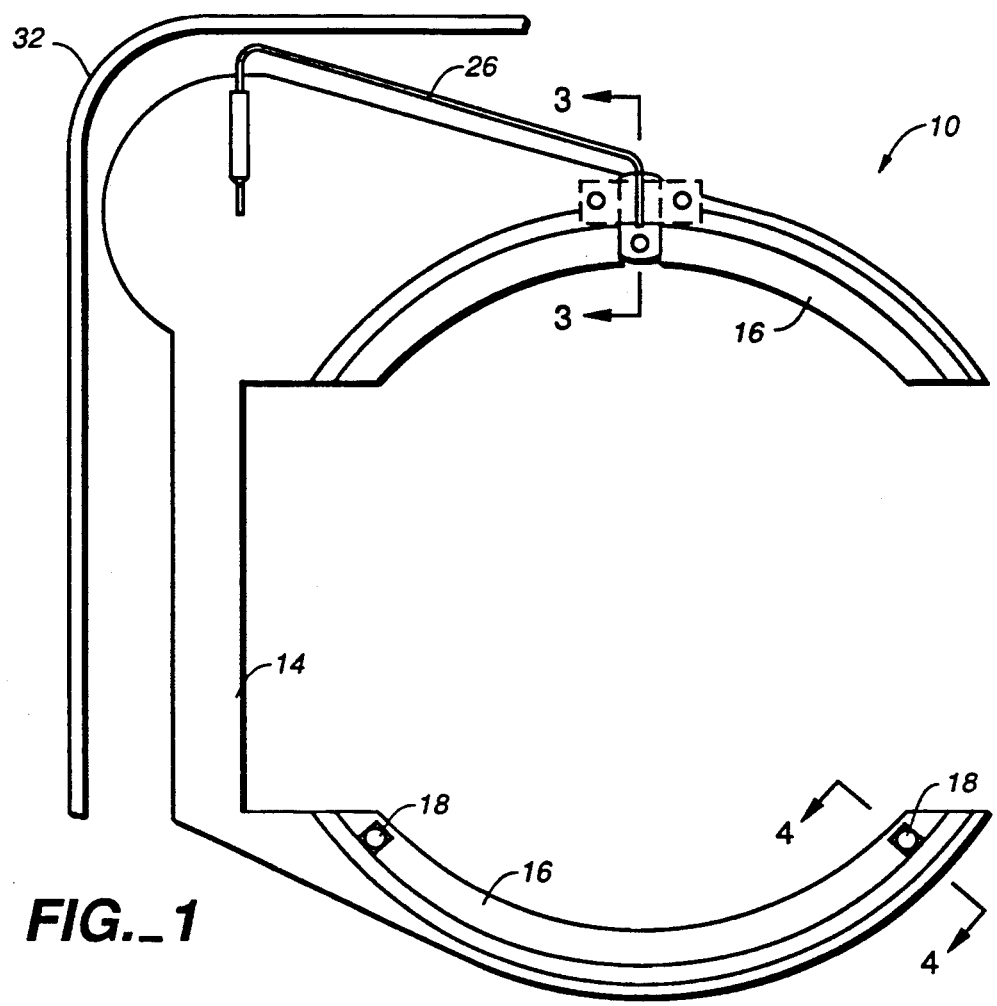
FIG._1
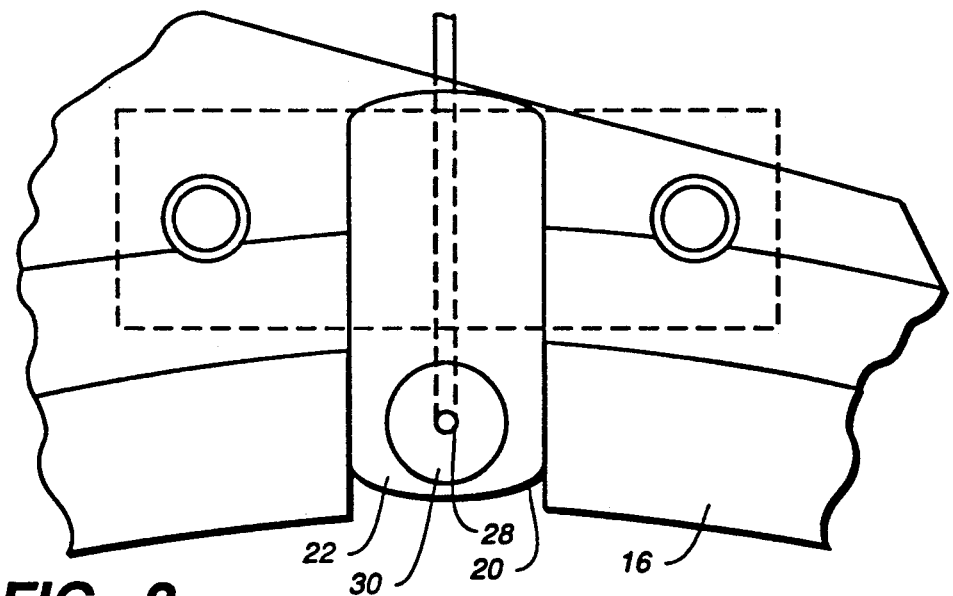
FIG._2

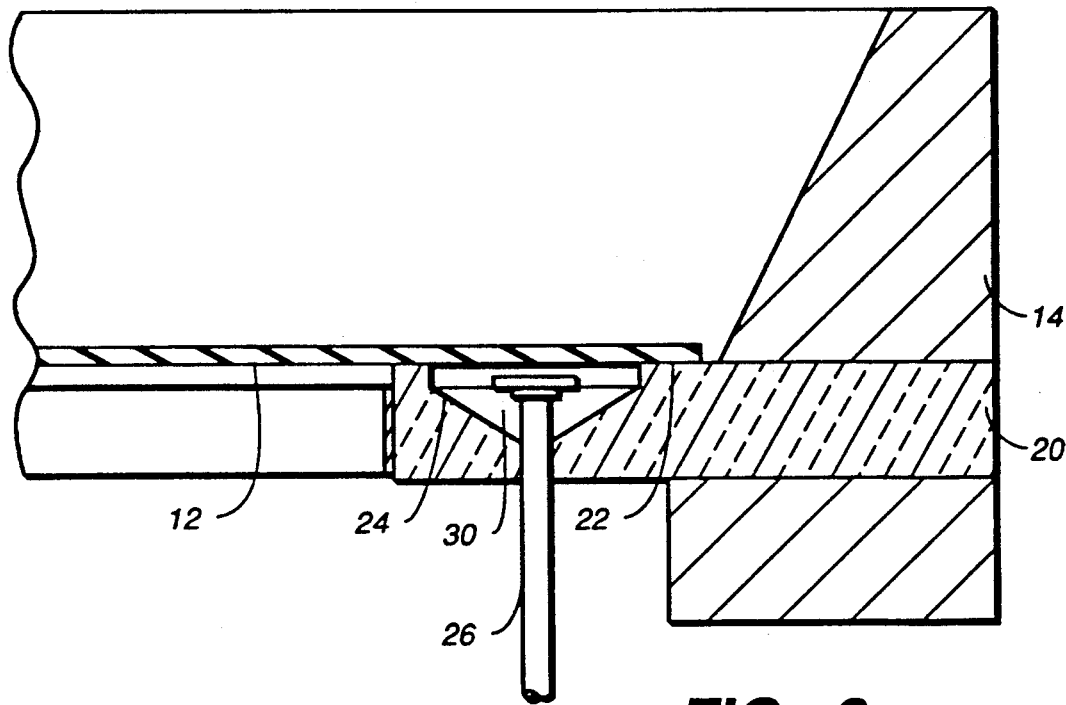
FIG._3
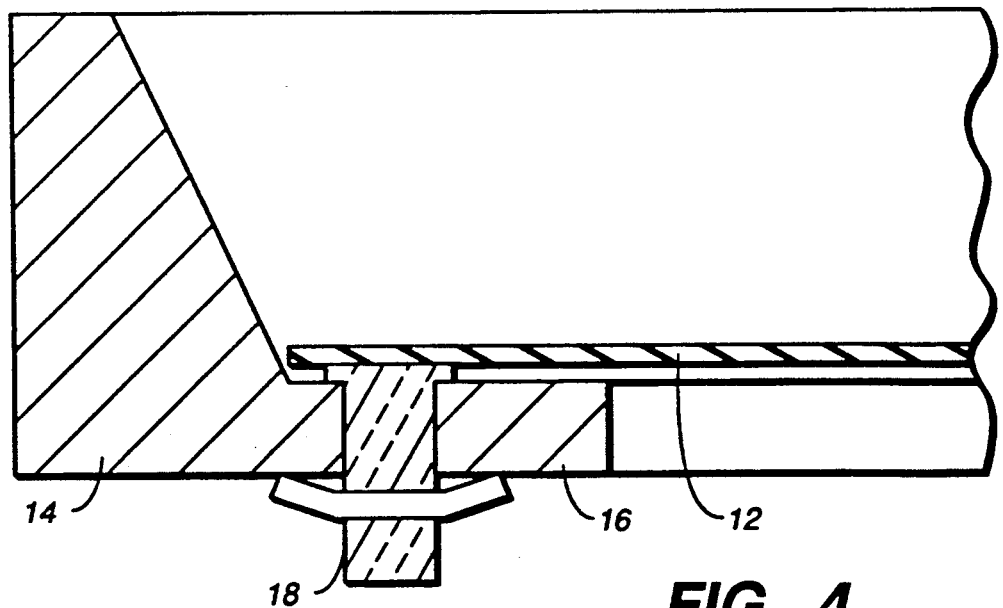
FIG._4

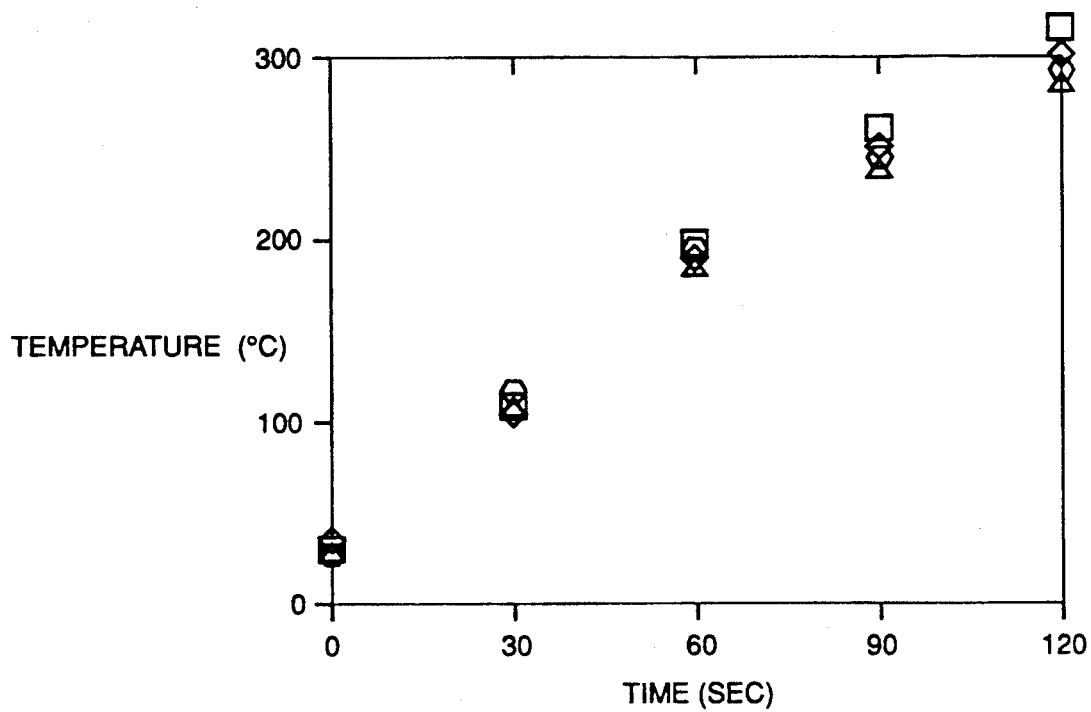
FIG._5
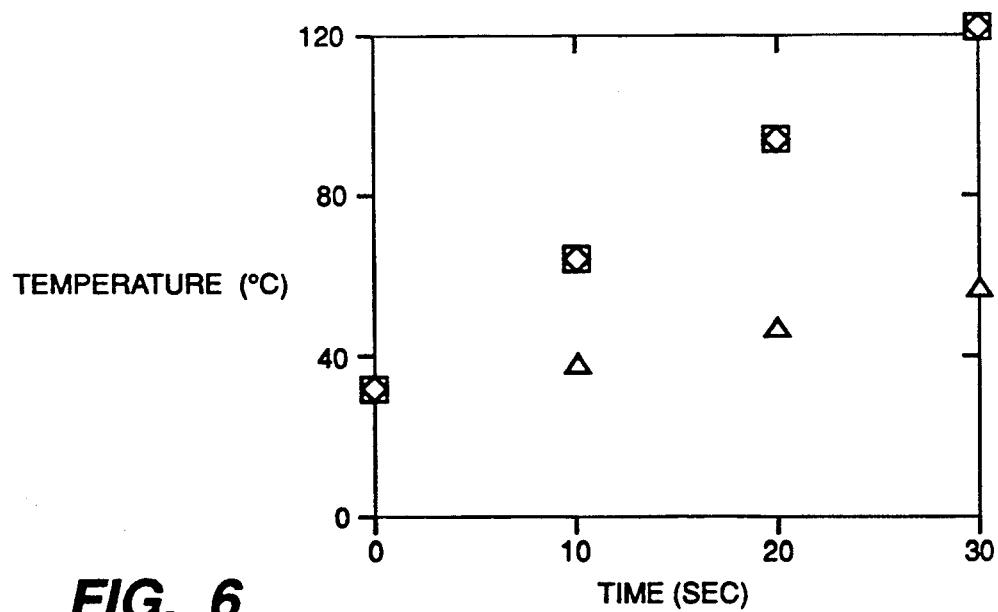
FIG._6

APPARATUS FOR MEASURING TEMPERATURE OF WAFER

BACKGROUND OF THE INVENTION

This invention relates to an apparatus for measuring the temperature of a wafer and more particularly to an apparatus for measuring the temperature of a wafer by a non-contact method.

Both direct and indirect methods have been in use for measuring the temperature of a wafer. By the direct method it is meant a method whereby a sensor is brought into direct contact with the target wafer. When a sensor is thus brought into contact with the wafer, however, the contact itself tends to cause a change in the wafer temperature, thereby adversely affecting the accuracy of the measurement. Another disadvantage of direct measurements is that the wafer may be more easily contaminated by the contact. As for the indirect methods, on the other hand, the accuracy of measurement cannot be expected to be high since what is actually measured is the temperature of some other medium which is in contact with the target wafer. When there is a sudden change in the wafer temperature, furthermore, there is bound to be a time delay before such a change can be detected. This also adversely affects the accuracy of the measurement.

SUMMARY OF THE INVENTION

It is therefore a general object of this invention to provide an apparatus for measuring the temperature of a wafer accurately and without contaminating the subject wafer.

It is a more specific object of the invention to provide such an apparatus for measuring the temperature of a wafer by a non-contact method.

An apparatus embodying the present invention, with which the above and other objects may be achieved, is characterized as having a means for supporting the wafer at a specified position, a heat collector, a thermocouple and a heat reflector. The heat collector is mounted at one end of the thermocouple and is disposed so as to be near but not in contact with a wafer placed at this specified position. The heat reflector is disposed on the opposite side of the heat collector distal from the wafer such that radiant heat from the wafer surface is effectively collected by the heat collector and hence the wafer temperature can be measured accurately.

BRIEF DESCRIPTION OF THE DRAWINGS

The accompanying drawings, which are incorporated in and form a part of the specification, illustrate an embodiment of the present invention and serve to explain the principles of the invention. In the drawings:

FIG. 1 is a plan view of a portion of an apparatus embodying the invention,

FIG. 2 is an enlarged portion of FIG. 1 for more clearly showing the structure around the collector, FIG. 3 is a sectional view taken along the line 3—3 of FIG. 1 with a wafer in the position of measurement, FIG. 4 is a sectional view taken along the line 4—4 of FIG. 1 with a wafer in the position of measurement, FIG. 5 is a graph showing the results of measurement of wafer temperature by using different kinds of thermocouple, and FIG. 6 is a graph showing the results of measurement of water temperature by contact and non-contact methods.

DETAILED DESCRIPTION OF THE INVENTION

FIGS. 1-4 show principal portions of an apparatus 10 with which the temperature of a wafer (shown at 12 in FIGS. 3 and 4) can be measured by a method embodying the present invention. A lifter 14 serving as supporting means for the wafer 12 is provided with two arms each with a circularly arcuate ledge part 16 such that the wafer 12 can be supported horizontally with its peripheral parts resting thereon.

Explained in more detail, the wafer 12 is supported horizontally from below at three positions which are nearly evenly separated as shown in FIG. 1. Two of these positions are on one of the two arms of the lifter 14 where thermally insulative pieces 18 protrude upwards from the ledge part 16 as more clearly shown in FIG. 4. The third of these three wafer-supporting positions is where the wafer temperature is to be measured, and there is provided another thermally insulative piece 20 of a different shape having a wafer-supporting upper surface 22 in which a generally conical indentation 24 is formed as more clearly shown in FIG. 3.

A thermocouple 26 for measuring the wafer temperature is attached to the lifter 14. A heat collector 28, which may be a small copper piece capable of efficiently collecting radiant heat incident thereon, is attached to one end of the thermocouple 26 such that it will assume a position inside the conical indentation 24 and close to but not in contact with the wafer 12 lying on top of the wafer-supporting upper surface 22 of the insulative piece 20. A heat reflector 30 capable of efficiently reflecting radiant heat incident thereon is provided on the generally conical surface of the indentation 24 below the heat collector 28. A ceramic material with a metal coating or a metallic material such as stainless steel may be used for this purpose. Since the thermocouple 26 is intended to measure the temperature of the wafer 12 by collecting radiant heat emitted therefrom, the heat reflector 30 serves to improve the collection of heat by the heat collector 28. In this context, the thermally insulative piece 20 serves the additional purpose of eliminating effects from the lifter 14 on the thermocouple 26.

In FIG. 1, numeral 32 schematically indicates a vacuum chamber (or a housing thereof) enclosing the apparatus 10 as a whole to thereby provide therein a vacuum environment suitable for a wafer-production process.

Merits of using an apparatus as disclosed above have been demonstrated in a series of tests, the results of which are shown in FIGS. 5 and 6. In a first series of tests, the effects of the collector and the reflector were examined. In FIG. 5, the squares (with vertical and horizontal sides) indicate the real wafer temperatures measured by an independent method at different times as the wafer was heated, the tilted (by 45 degrees) squares indicate the temperatures measured by the thermocouple with both the reflector and the heat collector used, the hexagons indicate the temperatures measured by the thermocouple with the reflector but not the heat collector, and the triangles indicate the measured temperatures when neither the reflector nor the heat collector was used. The graph clearly shows that better results of measurement can be obtained with the use of a heat collector. Since heat is transmitted in vacuum mostly by radiation, it is to be expected that better results are obtainable with the additional use of a reflector.

In the second series of tests, the difference between a contact method and a non-contact method was examined. In FIG. 6, the squares with vertical and horizontal sides again indicate the wafer temperatures measured by an independent method for comparison at different times as the wafer was heated, the tilted squares indicate the wafer temperatures measured by a non-contacting method of the present invention with the use of both a heat collector and a reflector, and the triangles indicate the wafer temperatures measured by a contact method. FIG. 6 clearly indicates that a contact with the wafer has the undesirable effect of lowering the temperature of the subject wafer.

The foregoing description of a preferred embodiment of the invention has been presented for purposes of illustration. It is not intended to be exhaustive or to limit the invention to the precise form disclosed, and obviously many modifications and variations are possible in light of the above teaching. For example, the apparatus can be effectively operated outside a vacuum chamber in a non-vacuum environment. The embodiment was chosen and described in order to best explain the principles of the invention and its practical application to thereby enable others skilled in the art to best utilize the invention in various embodiments and with various modifications as are suited to the particular use contemplated. It is intended that any such modifications and variations are within the scope of the invention.

What is claimed is:

1. An apparatus for measuring the temperature of a wafer, said apparatus comprising supporting means having a support surface area for supporting a wafer thereon at a supported position, said supporting means having an indentation formed in said support surface area such that a wafer placed at said supported position covers said indentation, heat reflector means for reflecting radiant heat, said heat reflector means being disposed inside said indentation, and a thermocouple having a heat collector at one end thereof, said heat collector being disposed inside said indentation in non-contacting relationship with a wafer at said supported position.

2. The apparatus of claim 1 further comprising a vacuum chamber enclosing said supporting means therein.

3. The apparatus of claim 1 wherein said indentation is generally conical.

4. The apparatus of claim 1 wherein said supporting means includes two extended arcuate members for supporting a circular wafer at said supported position by its peripheral areas.

5. The apparatus of claim 1 wherein said supporting means has a thermally insulative section, said indentation being formed in said thermally insulative section.

6. The apparatus of claim 4 wherein one of said arcuate members has a thermally insulative section, said indentation being formed in said thermally insulative section.

7. The apparatus of claim 6 wherein the other of said arcuate members has two thermally insulative wafer-supporting pieces for supporting said circular wafer thereon at said supported position.

8. The apparatus of claim 7 wherein said two wafer-supporting pieces and said indentation are approximately at equidistance from one another.

9. The apparatus of claim 8 wherein said supporting means supports a wafer horizontally at said supported position on said two wafer-supporting pieces and said thermally insulative section around said indentation.

* * * * *